US006391516B1

(12) United States Patent
Vermeersch et al.

(10) Patent No.: US 6,391,516 B1
(45) Date of Patent: May 21, 2002

(54) HEAT SENSITIVE IMAGING ELEMENT AND METHOD FOR MAKING A PRINTING PLATE THEREWITH

(75) Inventors: Joan Vermeersch, Deinze; Marc Van Damme, Heverlee, both of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 08/751,764

(22) Filed: Nov. 8, 1996

Related U.S. Application Data

(60) Provisional application No. 60/011,003, filed on Feb. 1, 1996.

(30) Foreign Application Priority Data

Nov. 9, 1995 (EP) .......................................... 95203046

(51) Int. Cl.[7] .......................... G03F 7/30; G03F 7/40; G03F 7/038

(52) U.S. Cl. .................... 430/270.1; 430/302; 430/309; 430/330; 430/348; 430/964; 430/955; 430/927

(58) Field of Search ................................ 430/200, 330, 430/348, 964, 927, 302, 955, 270.1, 309; 427/273

(56) References Cited

U.S. PATENT DOCUMENTS 3,476,937 A * 11/1969 Vrancken .................... 430/348
3,679,410 A * 7/1972 Vrancken et al. ........... 430/330
4,004,924 A * 1/1977 Vrancken et al. ........... 430/302
4,868,016 A * 9/1989 Lorah et al. ................ 430/330
5,462,833 A * 10/1995 Hauquier et al. ........... 430/204

FOREIGN PATENT DOCUMENTS

EP 599510 * 6/1994 ................. 430/330
GB 9110417 * 1/1993 ................. 430/964

* cited by examiner

*Primary Examiner*—Richard L. Schilling
(74) *Attorney, Agent, or Firm*—Breiner & Breiner, L.L.C.

(57) ABSTRACT

The present invention discloses an imaging element comprising on a hydrophilic surface of a lithographic base an image forming layer comprising hydrophobic thermoplastic polymer particles dispersed in a hydrophilic binder and (ii) a compound capable of converting light to heat, said compound being comprised in said image forming layer or a layer adjacent thereto, characterised in that said image forming layer further comprises a cross-linking agent capable of cross-linking said hydrophilic binder upon heating in a ratio between 1:100 and 200:1 by weight versus the hydrophilic binder.

The present invention further provides a method for making a printing plate therewith. According to this method, the above imaging element is preferably exposed by means of a laser and is subsequently developed with plain water or an aqueous liquid.

12 Claims, No Drawings

HEAT SENSITIVE IMAGING ELEMENT AND METHOD FOR MAKING A PRINTING PLATE THEREWITH

Priority is claimed under 35 USC 119(E) based on provisional application Ser. No. 60/011,003 filed Feb. 1, 1996.

DESCRIPTION

1. Field of the Invention.

The present invention relates to a method for making a printing plate involving the use of a heat sensitive imaging element and that can be developed by means of plain water or an aqueous liquid.

2. Background of the Invention

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon image-wise exposure of the light-sensitive layer the exposed image areas become insoluble and the unexposed areas remain soluble. The plate is then developed with a suitable liquid to remove the diazonium salt or diazo resin in the unexposed areas.

Commercially available diazo based printing plates most commonly use an anodized and roughened aluminium as a support having a hydrophilic surface since they offer the advantage of a high printing endurance. A particular disadvantage of such type of printing plates is that they require special developing liquids for development which is costly and inconvenient.

EP-A 601240 discloses a diazo based printing plate that uses a polyester film provided with a cross-linked hydrophilic layer as a lithographic base on which a photosensitive diazo layer is provided. Such a diazo based printing plate can be developed by rinsing it with plain water subsequent to image-wise exposure.

Commercial plates are also available that use a flexible support such as paper provided with a hydrophilic layer. For example, Lithocraft 10008 FOTOPLATE™ is a diazo based printing plate that comprises on a paper support a hydrophilic layer on top of which is provided a diazo based photosensitive layer. According to plate instructions of the supplier, a plate can be prepared by image-wise exposure of the lithographic printing plate precursor or imaging element, mounting the exposed imaging element on the press and wiping its surface with Lithocraft® 10008 Developer Desensitizer. The plate instructions also contemplate a method wherein no developer desensitizer is used. However, such method most often results in poor lithographic performance so that in practice a Developer Desensitizer is almost always needed.

A particular disadvantage that the above diazo-based printing plates carry in common irrespective of the type of lithographic base used, is that they have to be shielded from the light. Moreover, diazo's are insufficiently sensitive to be exposed by means of a commercial and economical laser.

On the other hand, methods are known for making printing plates involving the use of imaging elements that are heat sensitive rather than photosensitive. For example, Research Disclosure no. 33303 of January 1992 discloses a heat sensitive imaging element comprising on a support a cross-linked hydrophilic layer containing thermoplastic polymer particles and an infrared absorbing pigment such as e.g. carbon black. By image-wise exposure to an Infrared laser, the thermoplastic polymer particles are image-wise coagulated thereby rendering the surface of the imaging element and these areas ink acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

FR-A-1,561,957 describes a recording material comprising at least a recording layer containing a hydrophilic binder and an hydrophobic compound dispersed in said hydrophylic binder. Upon irradiation and development said recording material can be used as a planographic printing plate.

U.S. Pat. No. 3,476,937 describes also a recording material comprising at least a recording layer containing a hydrophilic binder and an hydrophobic compound dispersed in said hydrophylic binder. Upon irradiation and development said recording material can be used as a planographic printing plate.

U.S. Pat. No. 3,580,719 describes an imaging element containing a recording layer containing at least about 80% by weight of a normally water-soluble polymer which, when heated, undergoes a loss in its normal solubility in aqueous solvent.

The three last imaging elements all have the disadvantage that the corresponding printing plates have low printing endurances.

EP 514.145 describes a method for making a printing plate wherein a heat-sensitive imaging element is used that comprises on a lithographic base such as an anodised aluminium an image forming layer comprising core-shell particles and a light to heat converting substance. The shell of these particles is hydrophilic in nature and renders the particles developable. The core is hydrophobic in nature and flows out when heated. Thus upon image-wise exposure with an infrared laser diode, the image-forming layer can be rendered insoluble at the exposed areas. At the non-exposed areas, the image forming layer can be removed by means of an aqueous developer containing ethanolamine. Subsequent the material is baked. Although such printing plates can yield a high printing endurance, their development puts a burden on the environment because of the use of an alkanol amine.

SUMMARY OF THE INVENTION

Accordingly, it is an object of the present invention to provide a heat-sensitive imaging element for making a printing plate that can be developed in a convenient and environmental friendly way and that preferably can be exposed by means of a commercially available laser.

It is a further object of the present invention to provide a heat-sensitive imaging element that can be used to obtain printing plates having a high printing endurance.

Further objects of the invention will become clear from the description hereinafter.

The present invention provides an imaging element comprising (i) on a hydrophilic surface of a lithographic base an image forming layer comprising hydrophobic thermoplastic polymer particles dispersed in a hydrophilic binder and (ii) a compound capable of converting light to heat, said compound being comprised in said image forming layer or a layer adjacent thereto, characterised in that said image forming layer further comprises a cross-linking agent capable of cross-linking said hydrophilic binder upon heating in a ratio between 1:100 and 200:1 by weight versus the hydrophilic binder.

Further, this invention provides a method for making a lithographic printing plate comprising the steps of:

(1) image-wise exposing an imaging element as defined above to light;

(2) developing a thus obtained image-wise exposed imaging element it with plain water or an aqueous liquid;

(3) and optionally overall heating a thus obtained imaged imaging element.

DETAILED DESCRIPTION OF THE INVENTION

An imaging element for use in accordance with the present invention comprises on a hydrophilic surface of a lithographic base an image forming layer comprising hydrophobic thermoplastic polymer particles dispersed in a hydrophilic binder and a cross-linking agent capable of cross-linking the hydrophilic binder upon heating. The hydrophilic binder used in connection with the present invention is perferably not cross-linked or only slightly cross-linked. The imaging element further includes a compound capable of converting light to heat. This compound is preferably comprised in the image forming layer but can also be provided in a layer adjacent to the image forming layer.

According to one embodiment of the present invention, the lithographic base can be an anodised aluminium. A particularly preferred lithographic base is an electrochemically grained and anodised aluminium support. According to the present invention, an anodised aluminium support may be treated to improve the hydrophilic properties of its surface. For example, the aluminium support may be silicated by treating its surface with sodium silicate solution at elevated temperature, e.g. 95° C. Alternatively, a phosphate treatment may be applied which involves treating the aluminium oxide surface with a phosphate solution that may further contain an inorganic fluoride. Further, the aluminium oxide surface may be rinsed with a citric acid or citrate solution. This treatment may be carried out at room temperature or can be carried out at a slightly elevated temperature of about 30 to 50° C. A further interesting treatment involves rinsing the aluminium oxide surface with a bicarbonate solution. It is further evident that one or more of these post treatments may be carried out alone or in combination.

According to another embodiment in connection with the present invention, the lithographic base comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöbber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present embodiment are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. a polyester such as a substrated polyethylene terephthalate film or polyethylene naphthalate film, cellulose acetate film, polystyrene film, polycarbonate film etc . . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is 200 mg per $m^2$ and 750 mg per $m^2$. Further, the ratio of silica to hydrophilic binder is preferably more than 1 and the surface area of the colloidal silica is preferably at least 300 $m^2$ per gram, more preferably a surface area of 500 $m^2$ per gram.

In accordance with the present invention, on top of a hydrophilic surface there is provided an image forming layer. Optionally, there may be provided one or more intermediate layers between the lithographic base and the image forming layer. An image forming layer in connection with the present invention comprises thermoplastic polymer particles dispersed in a hydrophilic binder and a cross-linking agent that can be activated by heat.

Suitable hydrophilic binders for use in an image forming layer in connection with this invention are preferably those that contain reactive groups e.g. hydroxy, amine or carboxyl groups. Specific examples of hydrophilic binders are synthetic homo or copolymers such as a polyvinylalcohol, dimethylhydantoine-formaldehyde resin, a poly(meth) acrylic acid, a poly(meth)acrylamide, a polyhydroxyethyl (meth)acrylate, a polyvinylmethylether or natural binders such as gelatin, a polysacharide such as e.g. dextran, pullulan, cellulose arabic gum, alginic acid.

Hydrophobic thermoplastic polymer particles used in connection with the present invention have a preferably a glass transition temperature of at least 90° C., more preferably of at least 100° C.

Hydrophobic thermoplastic polymer particles used in connection with the present invention preferably have a coagulation temperature above 50° C. and more preferably above 70° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. When said polymer particles are subjected to a temperature above coagulation temperature they coagulate to form a hydrophobic agglomerate in the hydrophilic layer so that at these parts the hydrophilic layer becomes insoluble in plain water or an aqueous liquid.

Specific examples of hydrophobic polymer particles for use in connection with the present invention are e.g. polystyrene, polyvinyl chloride, polymethyl methacrylate, polyvinylidene chloride, polyacrylonitrile, polyvinyl carbazole etc. or copolymers and/or mixtures thereof. Most preferably used is polymethyl methacrylate.

The weight average molecular weight of the polymers may range from 5,000 to 1,000,000 g/mol.

The hydrophobic particles may have a particle size from 0.01 $\mu$m to 50 $\mu$m, more preferably between 0.05 $\mu$m and 10 $\mu$m and most preferably between 0.05 $\mu$m and 0.5 $\mu$m.

The polymer particles are present as a dispersion in the aqueous coating liquid of the image forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the image forming layer is preferably above 35% by weight and more preferably above 50% by weight and most preferably above 65% by weight.

Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

A light to heat converting compound in connection with the present invention is most preferably added to the image forming layer but at least part of the light to heat converting compound may also be comprised in a neighbouring layer. Such layer can be for example the cross-linked hydrophilic layer of a lithographic base according to the second embodiment of lithographic bases explained above.

Suitable heat-activatable cross-linking agents for use in the image forming layer in connection with the present invention are used in a ratio between 1:100 to 200:1 by weight versus the hydrophilic binder, more preferably in a ratio between 1:50 to 50:1, most preferably in a ratio between 1:10 to 10:1.

Suitable heat-activatable cross-linking agents for use in the image forming layer in connection with the present invention are preferably compounds that have two or more groups that can react with the hydrophilic binder, e.g. with one of the reactive groups listed above. A cross-linking agent in connection with the present invention may be a low molecular weight compound or may be an oligomer or polymer. Examples of suitable cross-linking agents for use in an image forming layer in accordance with the present invention are e.g. aldehydes such as formaldehyde, hexamethoxymethyl melamine, amine-formaldehyde resins such as e.g. melamine-formaldehyde resin or guanamine-formaldehyde resin, dimethylolurea-formaldehyde resins, phenol-formaldehyde resins, compounds having two or more expoxy groups e.g. a polymer having epoxy groups etc . . . .

It is preferred in connection with the present invention to further add a catalyst to an image forming layer in connection with the present invention. Such catalyst will speed-up the crosslinking reaction and accordingly total plate making time can be reduced while maintaining a high level of cross-linking needed to obtain a high printing endurance. Particularly suitable catalysts for use in this context are acid catalysts. It may furthermore be advantageous to use a precursor of a catalyst so as to improve the selectivity of the process and to obtain the best lithographic performance. Such a precursor will convert to the actual catalyst upon heating i.e. the catalyst will be formed at least partially during the image-wise exposure.

Suitable precursors of a catalyst are for example precursors that release an acid upon heating. Particular examples of suitable acid releasing catalyst precursors are sulfonium compounds, in particular benzylsulfonium compounds, as disclosed in e.g. EP 612065, EP 615233, and U.S. Pat. No. 5,326,677, inorganic nitrates such as e.g. $Mg(NO_3)_2.6H_2O$ or organic nitrates such as guanidinium nitrate, ammonium nitrate, pyridinium nitrate etc. . . . as disclosed in EP 462763, WO 81/1755, U.S. Pat. No. 4,370,401, compounds that release a sulfonic acid such as 3-sulfolenes, e.g. 2,5-dihydrothio-thiophene-1,1-dioxides as disclosed in U.S. Pat. No. 5,312,721, thermolytic compounds disclosed in GB 1.204.495, co-cristalin adducts of an amine and an volatile organic acid as disclosed in U.S. Pat. No. 3,669,747, aralkylcyanoforms as disclosed in U.S. Pat. No. 3,166,583, thermo-acids disclosed in EP 159725 and DE 3515176, squaric acid generating compounds as disclosed in U.S. Pat. No. 5,278,031, acid generating compounds disclosed in U.S. Pat. NO. 5,225,314 and U.S. Pat. No. 5,227,277 and RD 11511 of November 1973.

In accordance with the method of the present invention for making a lithographic printing plate an imaging element in accordance with the present invention is image-wise exposed to light and subsequently developed preferably by rinsing it with plain water. The obtained imaged imaging element is then preferably overall heated to obtain the highest printing endurance.

During image-wise exposure, the compound capable of converting light into heat, absorbs the light used for image-exposure and converts this in heat so as to generate an image-wise pattern of heat in the image-forming layer. As a consequence of this heat, the hydrophobic thermoplastic polymer particles coagulate and render the image forming layer insoluble for plain water or an aqueous liquid while the non-exposed parts remain soluble in plain water or an aqueous liquid.

Subsequent to development, the imaged imaging element is preferably overall heated which will cause substantial cross-linking of the image-forming layer and accordingly will improve the wear resistance of the printing areas during printing. Nevertheless, even without the additional overall heating, a printing endurance can be obtained that is suitable for a number of print jobs.

It is particularly advantageous in connection with the present invention to apply a gum before subjecting the imaged imaging element to the overall heat treatment. This will secure the hydrophilic properties at the non-printing areas in particular when an anodised aluminium is used as a lithographic base. Suitable gums for this purpose are well-known and commercially available e.g. Polychrome PC965™ (Polychrome).

Image-wise exposure in connection with the present invention is preferably an image-wise scanning exposure involving the use of a laser or L.E.D. It is highly preferred in connection with the present invention to use a laser emitting in the infrared (IR) and/or near-infrared, i.e. emitting in the wavelength range 700–1500 nm. Particularly preferred for use in connection with the present invention are laser diodes emitting in the near-infrared.

A preferred imaging apparatus suitable for image-wise scanning exposure in accordance with the present invention preferably includes a laser output that can be provided directly to the imaging elements surface via lenses or other beam-guiding components, or transmitted to the surface of a blank imaging element from a remotely sited laser using a fiber-optic cable. A controller and associated positioning hardware maintains the beam output at a precise orientation with respect to the imaging elements surface, scans the output over the surface, and activates the laser at positions adjacent selected points or areas of the imaging element. The controller responds to incoming image signals corresponding to the original document and/or picture being copied onto the imaging element to produce a precise negative or positive image of that original. The image signals are stored as a bitmap data file on a computer. Such files may be generated by a raster image processor (RIP) or other suitable means. For example, a RIP can accept Input data in page-description language, which defines all of the features required to be transferred onto the imaging element, or as a combination of page-description language and one or more image data files. The bitmaps are constructed to define the hue of the color as well as screen frequencies and angles in case of amplitude modulation screening. However, the present invention is particularly suitable for use in combination with frequency modulation screening as disclosed in e.g. EP-A 571010, EP-A 620677 and EP-A 620674.

The imaging apparatus can be configured as a flatbed recorder or as a drum recorder, with the imaging element mounted to the interior or exterior cylindrical surface of the drum. In a preferred drum configuration, the requisite relative motion between the laser beam and the imaging element is achieved by rotating the drum(and the imaging element mounted thereon) about its axis and moving the beam parallel to the rotation axis, thereby scanning the imaging element circumferentially so the image "grows" in the axial direction. Alternatively, the beam can move parallel to the drum axis and, after each pass across the imaging element, increment angularly so that the image on the imaging element "grows" circumferentially. In both cases, after a complete scan by the beam and development, an image corresponding to the original will have been applied to the surface of the imaging element. In the flatbed configuration, the beam is drawn across either axis of the imaging element, and is indexed along the other axis after each pass. of course, the requisite relative motion between the beam and the imaging element may be produced by movement of the imaging element rather than (or in addition to) movement of the beam.

Regardless of the manner in which the beam is scanned, it is generally preferable (for reasons of speed) to employ a plurality of lasers and guide their outputs to a single writing array. The writing array is then indexed, after completion of each pass across or along the imaging element, a distance determined by the number of beams emanating from the array, and by the desired resolution (i.e. the number of image points per unit length.

The present invention will now be illustrated by way of the following examples, without however the intention to limit the invention thereto. All parts are by weight unless otherwise specified.

EXAMPLE 1

Preparation of a Lithographic Base

A 0.2 mm thick aluminium foil was degreased by immersing the foil in an aqueous solution containing 5 g/l of sodium hydroxide at 50° C. and rinsed with demineralised water. The foil was then electrochemically grained using an alternating current in an aqueous solution containing 4 g/l of hydrochloric acid, 4 g/l of hydroboric acid and 0.5 g/l of aluminium ions at a temperature of 35° C. and a current density of 1200 A/$m^2$ to form a surface topography with an average center-line roughness $R_a$ of 0.5 $\mu$m.

After rinsing with demineralised water the aluminium foil was then etched with an aqueous solution containing 300 g/l of sulfuric acid ate 60° C. for 180 seconds and rinsed with demineralised water at 25° C. for 30 seconds.

The foil was subsequently subjected to anodic oxidation in an aqueous solution containing 200 g/l of sulfuric acid at at temperature of 45° C., a voltage of about 10 V and a current density of 150 A/$m^2$ for about 300 seconds to form an anodic oxidation film of 3 g/$m^2$ $Al_2O_3$, then washed with demineralised water, post treated with a solution containing 20 g/l of sodium bicarbonated at 40° C. for 30 s, subsequently rinsed with demineralised water of 20° C. during 120 s and dried.

The obtained lithographic base was submersed in an aqueous solution containing 5% by weight of citric at 50° C. for 60 s, rinsed with demineralised water and dried at 40° C.

Preparation of the Imaging Element (Material)

An imaging element according to the invention was produced by preparing the following coating composition and coating it to the above described lithographic base in an amount of 30 g/$m^2$ (wet coating amount) and drying it at 35° C.

Preparation of a Coating Composition

To 10.8 g of a 20% dispersion of polymethylmethacrylate (particle diameter 90 nm) stabilised with Hostapal™ B (1% vs. polymer) in deionised water was subsequently added, while stirring, 4.5 g of a 15% dispersion of carbon black in water, 59.79 g of water and 25 g of a 2% solution of a 98% hydrolysed polyvinylacetate having a weight average molecular weight of 200000 g/mol in water and 2.5 g of a 1% solution of hexamethoxymethylam-ine in water.

Preparation of a Printing Plate and Printing Copies Therewith

The obtained imaging element was subjected to an image-wise scanning exposure using an infrared laser diode emitting at 830 nm. The scanspeed was 1 m/s, spot size 10 μm and 120 mW power on the plate surface. The imaging element was subsequent developed in a Polychrome PC28E™ processor filled with water in the developing section and a gum (Polychrome PC965™ ) in the gumming section.

The obtained printing plate was then mounted on a Heidelberg GTO46 offset press equipped with K+E 125 ink and as dampening liquid Rotamatic. 15000 clear copies were obtained with no inkacceptance in the non-image areas. Even after printing 15000 copies, no damage to the image areas could be seen.

EXAMPLE 2 (comparison)

Printing plates were prepared as described in example 1 but with the modification that hexamethoxymethylmelamine (cross-linker) was not used in the coating composition. Printing was carried out as in example 1 and only 6000 copies could be printed due to damage to the image areas.

What is claimed is:

1. An imaging element comprising (i) on a hydrophilic surface of a lithographic base an image forming layer comprising dispersed in a hydrophilic binder hydrophobic thermoplastic polymer particles, a cross-linking agent capable of cross-linking said hydrophilic binder upon heating in a ratio between 1:100 and 200:1 by weight versus the hydrophilic binder and (ii) a compound capable of converting light to heat, said compound being comprised in said image forming layer or a layer adjacent thereto wherein said hydrophilic binder is a compound selected from the group consisting of polyvinylalcohol, dimethylhydantoine-formaldehyde resin, a poly(meth)acrylamide, a polyhydroxy-ethyl(meth)acrylate, a polyvinylmethylether, a gelatin and a polysacharide and wherein said image forming layer further comprises a catalyst capable of catalyzing said cross-linking agent or a precursor of said catalyst that can be converted to a catalyst upon heating.

2. An imaging element according to claim 1 wherein said compound capable of converting light to heat is selected from the group consisting of an infrared absorbing dye, carbon black, a metal boride, a metal carbide, a metal nitride, a metal carbonitride and a conductive polymer particle.

3. An imaging element according to claim 1 wherein said lithographic base is an anodised aluminium or comprises a flexible support having thereon a cross-linked hydrophilic layer.

4. An imaging element according to claim 1 wherein said thermoplastic polymer particles have a coagulation temperature of above 50° C.

5. An imaging element according to claim 1 wherein said hydrophobic thermoplastic polymer particles are selected from the group consisting of polystyrene, polyvinyl chloride, polymethyl methacrylate, polyvinylidene chloride, polyacrylonitrile, polyvinyl carbazole etc. or copolymers and/or mixtures thereof.

6. An imaging element according to claim 1 wherein said hydrophilic binder comprises reactive groups and said cross-linking agent is capable of reacting with said reactive groups under the influence of heat.

7. An imaging element according to claim 6, wherein said reactive group is selected from the group consisting of a hydroxy, an amine and a carboxyl group.

8. A method for making a lithographic printing plate comprising the steps of:

(1) image-wise exposing an imaging element as defined in claim 1 to light;

(2) developing a thus obtained image-wise exposed imaging element with plain water or an aqueous liquid.

9. A method according to claim 8 wherein said image-wise exposure is a scanning exposure.

10. A method according to claim 9 wherein said scanning exposure is carried out by means of a laser or a plurality of lasers.

11. A method according to claim 8 wherein said image-wise exposed imaging element is overall heated subsequent to development.

12. A method according to claim 11 wherein said imaged imaging element is treated with a gum before overall heating.

* * * * *